(12) United States Patent
Bayerer

(10) Patent No.: US 8,922,030 B2
(45) Date of Patent: Dec. 30, 2014

(54) MOISTURE-TIGHT SEMICONDUCTOR MODULE AND METHOD FOR PRODUCING A MOISTURE-TIGHT SEMICONDUCTOR MODULE

(71) Applicant: Infineon Technologies AG, Neubiberg (DE)

(72) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/091,807

(22) Filed: Nov. 27, 2013

(65) Prior Publication Data

US 2014/0151868 A1 Jun. 5, 2014

(30) Foreign Application Priority Data

Nov. 30, 2012 (DE) .......................... 10 2012 222 015

(51) Int. Cl.
*H01L 23/29* (2006.01)
*H01L 23/00* (2006.01)
*H01L 23/02* (2006.01)
*H01L 23/16* (2006.01)

(52) U.S. Cl.
CPC ............... *H01L 23/16* (2013.01); *H01L 24/80* (2013.01); *H01L 23/02* (2013.01)
USPC ........................... 257/790; 257/787; 438/126

(58) Field of Classification Search
USPC .......... 257/676, 787, 790; 438/121, 125, 126, 438/127
See application file for complete search history.

(56) References Cited

U.S. PATENT DOCUMENTS

| | | | | |
|---|---|---|---|---|
| 4,731,644 A | * | 3/1988 | Neidig | 257/687 |
| 4,849,803 A | * | 7/1989 | Yamamoto et al. | 257/687 |
| 6,011,302 A | * | 1/2000 | Nakahira | 257/690 |
| 7,161,252 B2 | * | 1/2007 | Tsuneoka et al. | 257/787 |
| 2002/0070439 A1 | | 6/2002 | Hiramatsu et al. | |
| 2013/0334544 A1 | * | 12/2013 | Luruthudass et al. | 257/82 |
| 2014/0175462 A1 | * | 6/2014 | Lermer et al. | 257/82 |

FOREIGN PATENT DOCUMENTS

DE 102008045721 A1 9/2009

* cited by examiner

*Primary Examiner* — S. V. Clark
(74) *Attorney, Agent, or Firm* — Murphy, Bilak & Homiller, PLLC

(57) ABSTRACT

A semiconductor module is provided which is well protected against corrosion and/or other damage which can be caused by moisture and/or other harmful substances surrounding the semiconductor module. A method for producing such a semiconductor module is also provided.

20 Claims, 17 Drawing Sheets

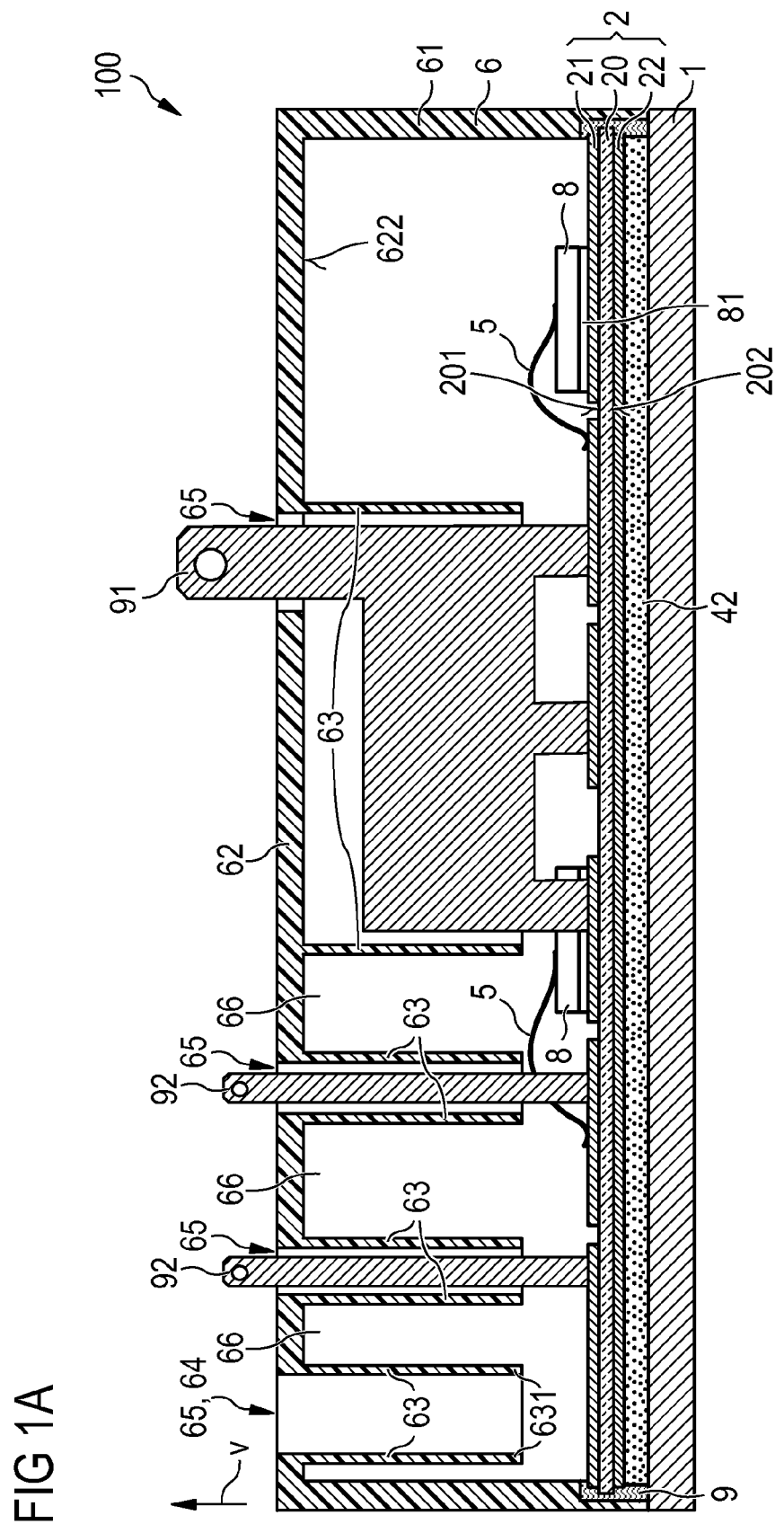

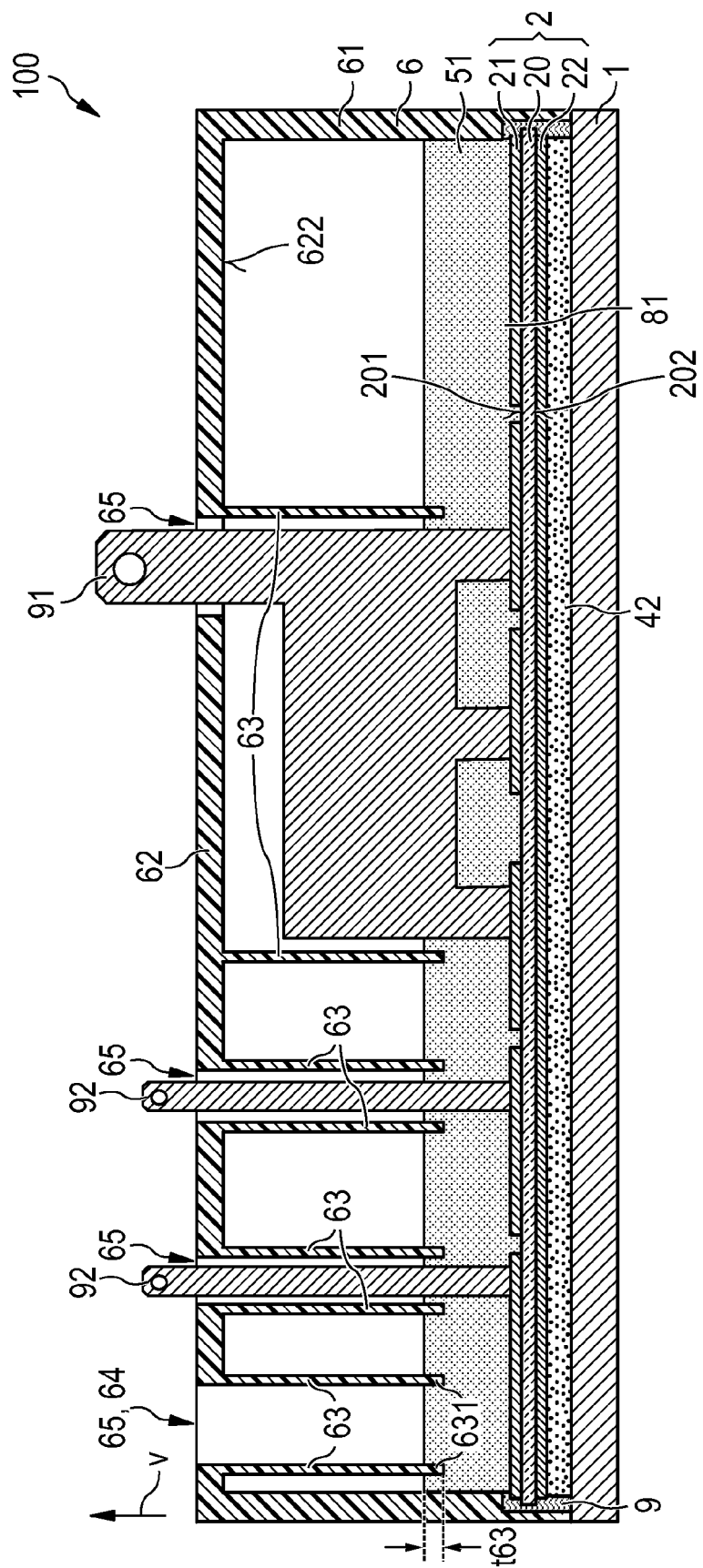

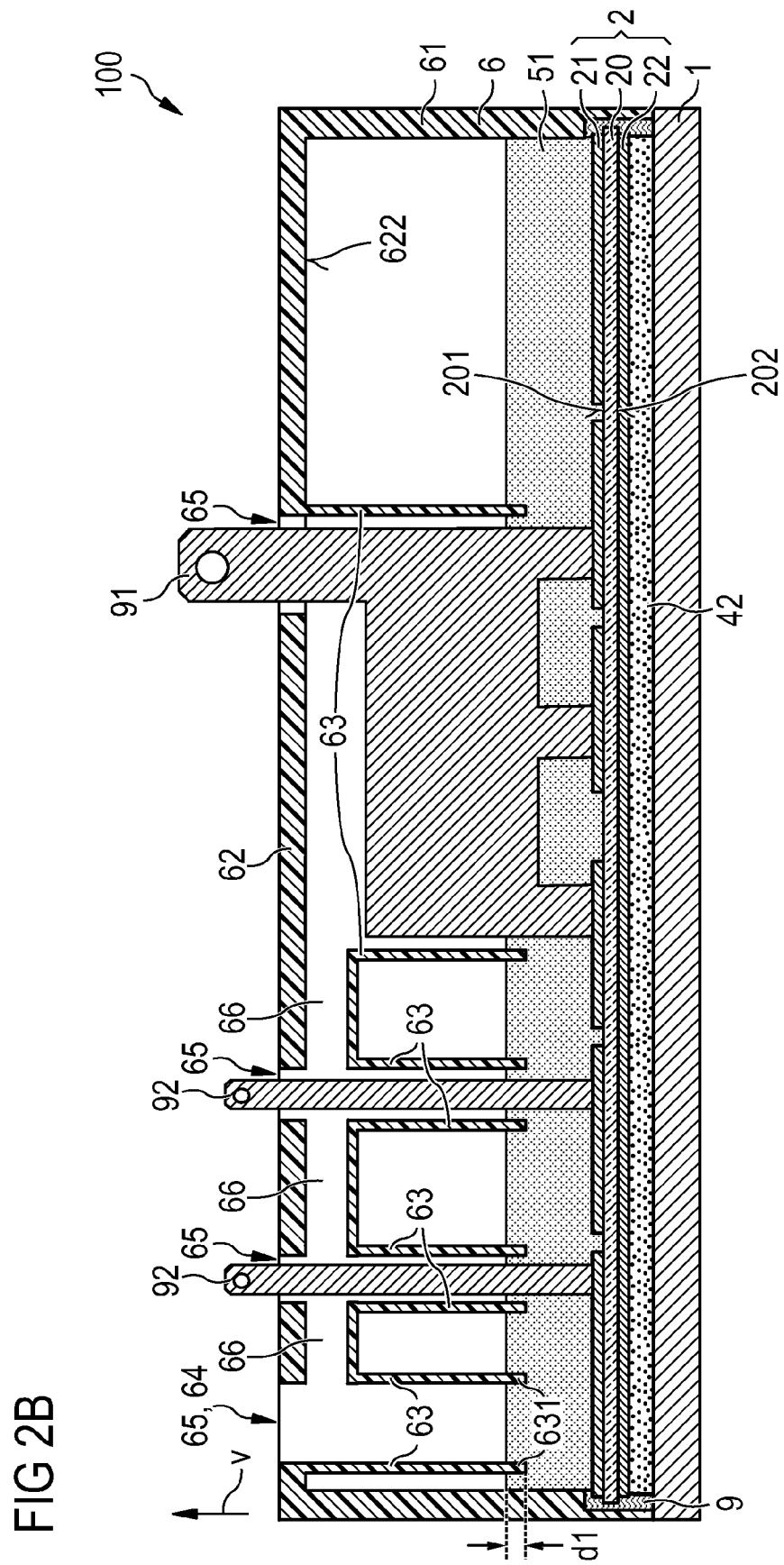

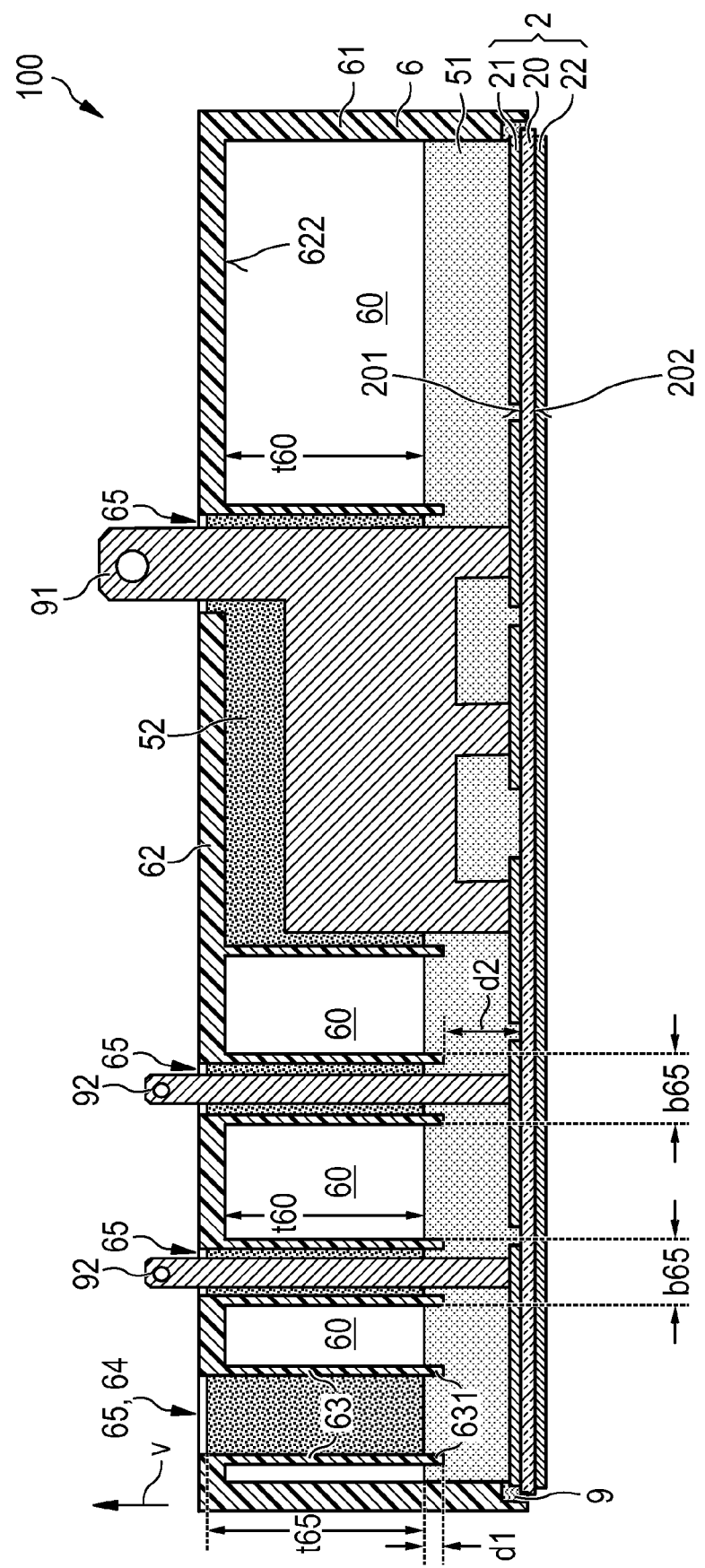

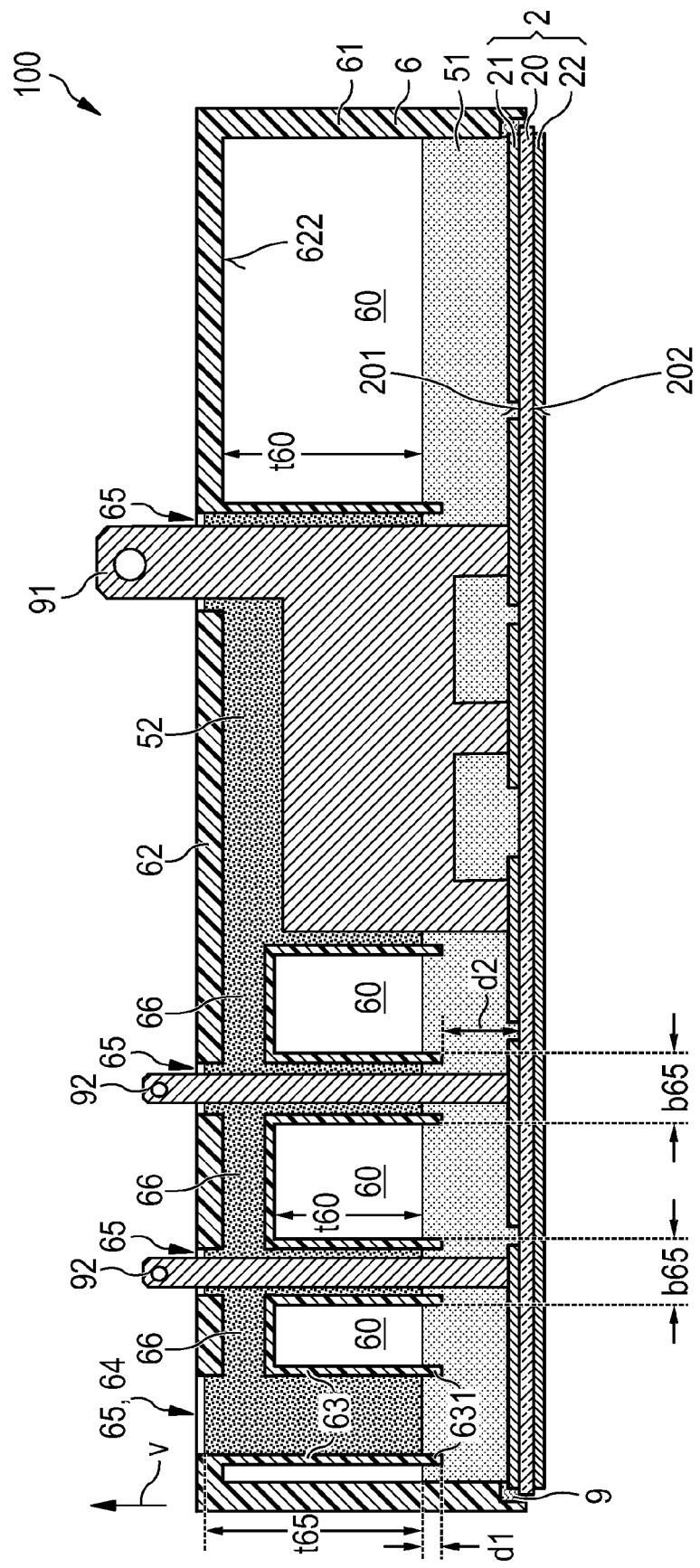

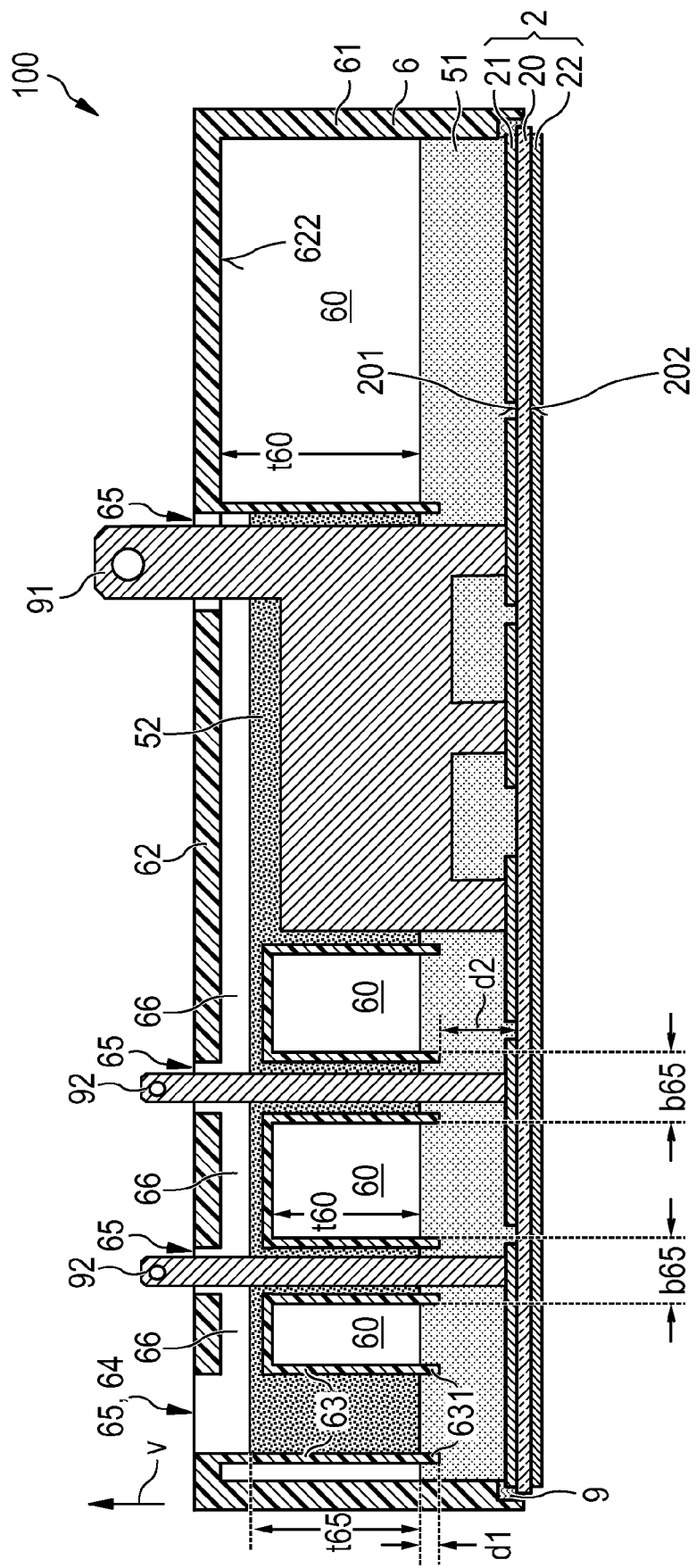

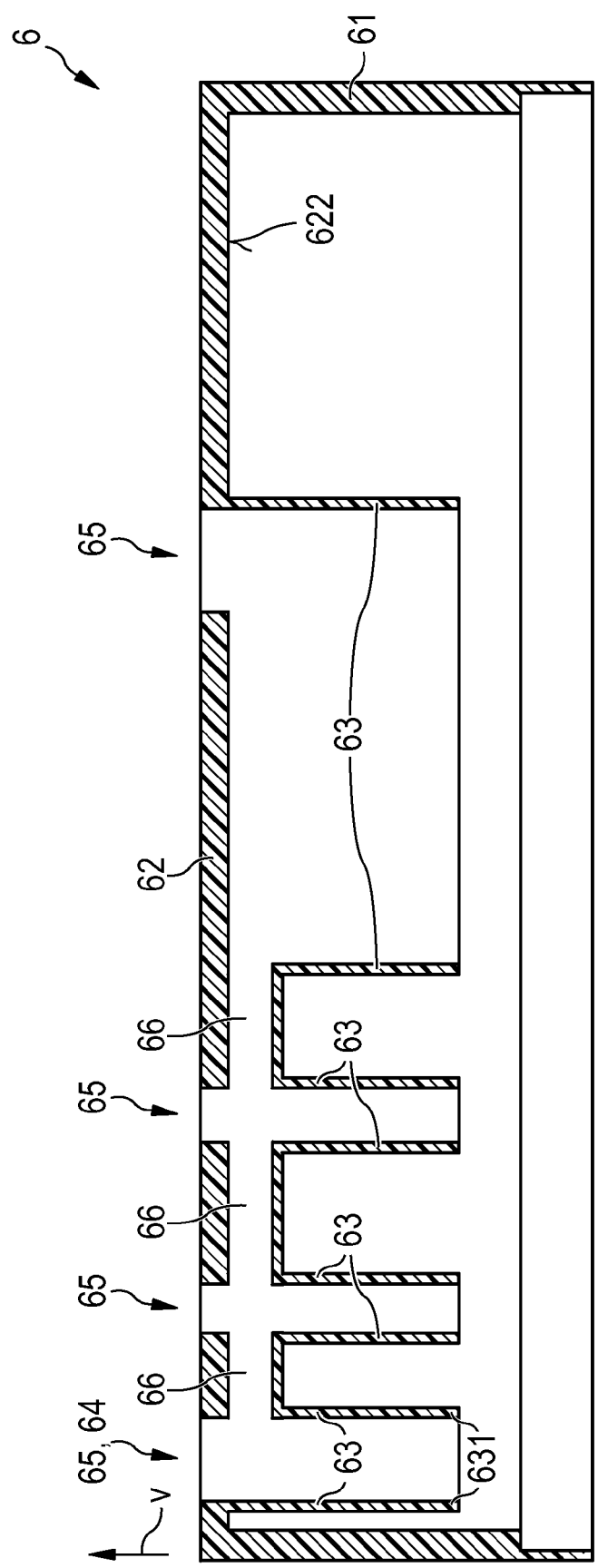

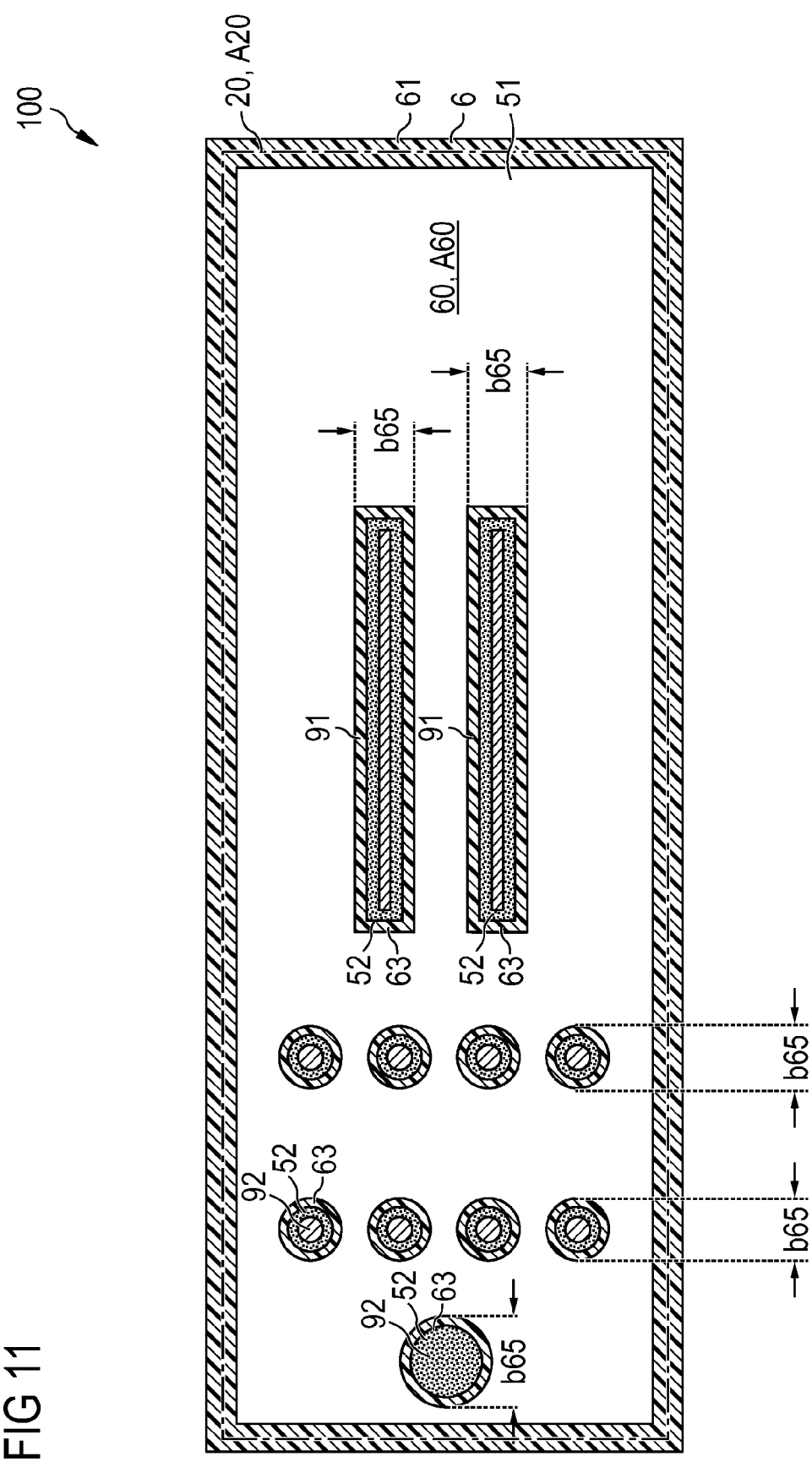

MOISTURE-TIGHT SEMICONDUCTOR MODULE AND METHOD FOR PRODUCING A MOISTURE-TIGHT SEMICONDUCTOR MODULE

TECHNICAL FIELD

The invention relates to semiconductor modules.

BACKGROUND

For making electrical contact with and connecting up a semiconductor module, electrical connections are required which have to be led through the housing to the outer side of the housing. Through the corresponding bushings on the housing, water vapor and/or other substances can penetrate into the interior of the semiconductor module, which can lead to impairment of the elements situated in the module, for example as a result of corrosion. Although semiconductor modules are potted with silicone gels for various reasons, said gels do not constitute a particularly good barrier for water vapor or other harmful substances, and so the problem outlined is scarcely improved.

In further module designs, that region of the housing interior which is situated above the silicone gel is filled with a hard potting composed of epoxy resin that bears on the silicone gel. Although such modules are less permeable to gases and water vapor than modules which contain a silicone gel but no hard potting, the hard potting encloses the silicone gel together with the housing. Silicone gels have a high coefficient of cubical thermal expansion, which, in the event of the semiconductor module being subjected to high loads resulting from temperature cycles, can give rise to an excess pressure or a reduced pressure which can cause damage in the interior of a module. In the case of excess pressure in the gel, it is possible for gel to escape between baseplate and housing. In the case of reduced pressure, cracks can form in the gel. Apart from that, in the corresponding commercially available modules, the purpose of the additional hard potting is to mechanically stabilize components in the interior of the semiconductor module.

SUMMARY

The object of the invention is to provide a semiconductor module which is well protected against corrosion and/or other damage which can be caused by moisture and/or other harmful substances surrounding the semiconductor module. A further object is to provide a method for producing such a semiconductor module.

According to an embodiment of a semiconductor module, the semiconductor module comprises a housing having two outer wall sections arranged at opposite sides of the housing, a cover extending from one of the outer wall sections to the other of the outer wall sections, and a first shaft wall arranged between the outer wall sections and spaced apart therefrom, said first shaft wall delimiting a first shaft. Furthermore, the semiconductor module comprises a circuit carrier having a top side, and also a semiconductor chip arranged in the housing and on the top side of the circuit carrier. An electrically conductive first connection element runs through the first shaft and extends out of the housing. A first potting compound is situated between the circuit carrier and the cover and partly between the first connection element and the first shaft wall, said first potting compound sealing the first shaft in interaction with the first connection element. The first shaft wall has, at its side facing the circuit carrier, a lower end dipping into the first potting compound. Optionally, the first potting compound can in this case extend continuously from the circuit carrier as far as above all semiconductor chips cohesively connected to the circuit carrier. In so far as said semiconductor chips are connected by bonding wires at their sides facing away from the circuit carrier, the first potting compound, likewise optionally, can also extend continuously beyond all of said bonding wires.

Furthermore, a second potting compound is situated between the first potting compound and the cover and partly between the first connection element and the first shaft wall, said second potting compound likewise sealing the first shaft in interaction with the first connection element. Moreover, one or a plurality of volume regions which directly adjoin the first potting compound in each case and are filled with gas are present in the housing. The gas situated in the volume region or in the volume regions compensates for a change—caused e.g. by a change in temperature—in the volume of the first potting compound, such that the elements situated in the module are not subjected to any disturbing loads.

The second potting compound acts as a diffusion barrier in particular against the penetration of water vapor into the interior of the module housing. For this purpose, the second potting compound can optionally have a diffusion coefficient for water vapor which is less than $5*10^{-9}$ m$^2$/s (=5E-9 m$^2$/s), relative to a temperature of 40° C.

The penetration of water vapor into the interior of the module housing is substantially determined by the lengths and the cross sections of the second potting compound in the regions in which it closes the shafts, and by the water vapor diffusion coefficient of the second potting compound. Overall, a desired minimum impermeability of the semiconductor module against the penetration of water vapor into the interior of the module housing can be set by means of a combination of the parameters mentioned. The statements above analogously also apply to the penetration of harmful substances other than water vapor into the interior of the module housing.

In order to produce such a semiconductor module, an integral or multipartite housing is provided, having two outer wall sections, a cover and a first shaft wall. The outer wall sections are situated at opposite sides of the housing. A circuit carrier having a top side, a semiconductor chip and an electrically conductive first connection element are likewise provided. The semiconductor chip, the circuit carrier, the housing and the first connection element are arranged relative to one another in such a way that the cover extends from one of the outer wall sections to the other of the outer wall sections, that the first shaft wall is arranged between the outer wall sections and delimits a first shaft, that the semiconductor chip is arranged in the housing and is arranged on the top side of the circuit carrier, and that the first connection element runs through the first shaft and extends out of the housing.

A first potting compound is filled into the interior of the housing and subsequently crosslinked, such that the crosslinked first potting compound is arranged between the circuit carrier and the cover and partly between the first connection element and the first shaft wall and seals the first shaft in interaction with the first connection element, wherein the first shaft wall has a lower end dipping into the first potting compound.

After the crosslinking of the first potting compound, a second potting compound is filled into the interior of the housing in such a way that the second potting compound is arranged between the first potting compound and the cover and partly between the first connection element and the first shaft wall and seals the first shaft in interaction with the first connection element, and that one or a plurality of gas-filled volume regions directly adjoining the first potting compound in each case remain in the housing.

Those skilled in the art will recognize additional features and advantages upon reading the following detailed description, and upon viewing the accompanying drawings.

BRIEF DESCRIPTION OF THE DRAWINGS

Various possible configurations of the invention are explained below with reference to the accompanying figures. The components shown in the figures are not necessarily illustrated to scale with respect to one another, rather importance has been attached to illustrating the principles of the invention. Furthermore, in the figures identical reference signs designate identical elements or elements corresponding to one another.

FIGS. 1A to 10 show different steps during the production of a semiconductor module having a solid baseplate.

FIGS. 2A to 2C show different steps during the production of a further semiconductor module having a solid baseplate.

FIG. 3 shows a semiconductor module which differs from the semiconductor module in accordance with FIG. 10 by virtue of the absence of a baseplate.

FIG. 4 shows a semiconductor module wherein shafts each having an electrical connection element arranged therein are connected to one another by a connecting channel.

FIG. 5 shows a semiconductor module which differs from the semiconductor module in accordance with FIG. 3 in that the second potting compound does not extend as far as that side of the housing cover which faces the circuit carrier.

FIG. 6 shows a semiconductor module which differs from the semiconductor module in accordance with FIG. 4 in that the second potting compound does not extend as far as that side of the housing cover which faces the circuit carrier.

FIG. 7 shows an integral housing of a semiconductor module.

FIG. 9 shows a comparative module which is constructed in accordance with a semiconductor module of the present invention, but in which a sensor for detecting the relative air humidity is inserted into a cavity produced in the first potting compound.

FIG. 10 shows a diagram which reveals, for two different semiconductor modules constructed according to the present invention, wherein the semiconductor chip was replaced in each case by an air-filled cavity, the profile of the relative air humidity present in the cavity when the comparative module is introduced into a moist atmosphere.

FIG. 11 shows a horizontal section through the arrangement in accordance with FIG. 6 in a sectional plane E-E running through the shafts and the volume regions.

DETAILED DESCRIPTION

Figure 1C:
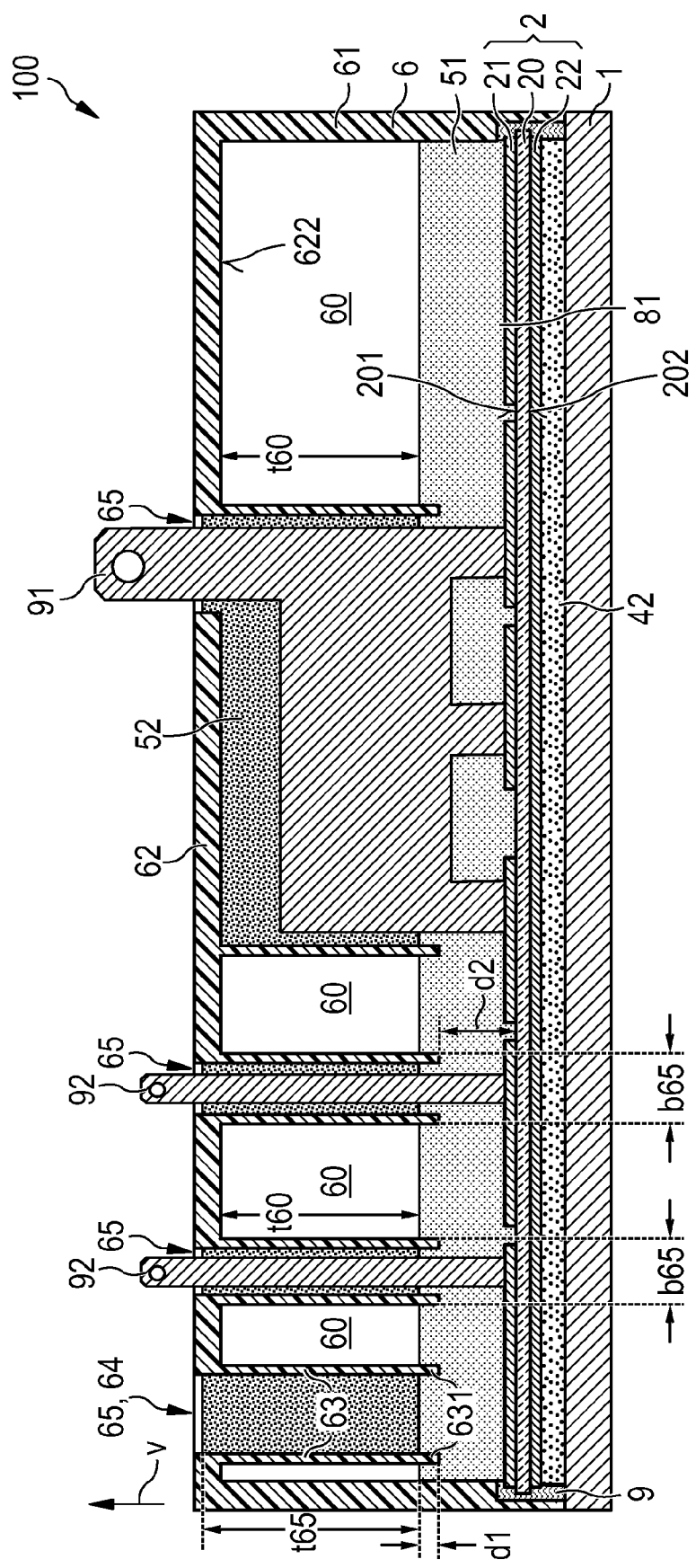

FIG. 1A shows a cross section through a partly finished semiconductor module 100. The semiconductor module 100 comprises a housing 6, one or a plurality of substrates 2, one or a plurality of semiconductor chips 8, and one or a plurality of electrically conductive connection elements 91, 92.

The housing 6 has two outer wall sections 61 arranged at opposite sides of the housing 6, a cover 62 extending from one of the outer wall sections 61 to the other of the outer wall sections 61, and one or a plurality of shaft walls 63 arranged between the outer wall sections 61 and spaced apart therefrom. Furthermore, one or a plurality of shafts 65 are present, each of which is delimited by at least one shaft wall 63. The electrically conductive connection elements 91, 92, which extend out of the housing 6, run in each case through one of the shafts 65. In this and all other semiconductor modules 100 of the invention, one, a plurality or all of the connection elements 91, 92 of the semiconductor module 100 can be spaced apart from the shaft wall 63 situated closest to the relevant connection element 91, 92.

Independently of this, a shaft wall 63 can optionally enclose one or a plurality of the connection elements 91, 92 in a ring-shaped manner. Likewise, there is also the possibility of a shaft 65 being delimited by an outer wall section 61 and a shaft wall 63 in such a way that said outer wall section 61 and said shaft wall 63 together enclose one of the connection elements 91, 92 in a ring-shaped manner.

The substrate 2 comprises an electrically insulating circuit carrier 20 having a top side 201 facing the housing 6. The semiconductor chip 8 is arranged in the housing 6 and on the top side 201 of the circuit carrier 20. In other configurations, an electrically conductive circuit carrier 20, for example composed of metal, can also be used. A structured upper metallization layer 21 is applied to the top side 201 of the circuit carrier 20, and a lower metallization layer 22, which can be unstructured or structured, is applied to the underside 202 of the circuit carrier, said underside being opposite the top side 201. The substrate 2 can be, for example, a DCB substrate (DCB=direct copper bonded), a DAB substrate (DAB=direct aluminum brazed) or an AMB substrate (AMB=active metal brazed).

The semiconductor chip or semiconductor chips 8 is/are mounted on the top-side metallization layer 21 and mechanically and optionally also electrically conductively connected by means of a connecting layer 81, for example a solder, an electrically conductive adhesive or a pressure-sintered silver-containing connecting layer. The semiconductor chips 8 can be, for example, arbitrary combinations of controllable semiconductor chips such as transistors, MOSFETs, IGBTs, thyristors, JFETs (inter alia also HEMTs [HEMT=High Electron Mobility Transistor]), and/or non-controllable semiconductor chips such as power diodes. The semiconductor chips 8 can be embodied as power semiconductor chips having high nominal currents, for example more than 10 A or more than 50 A, and/or having high rated reverse voltages of, for example, 400 V or more. In addition, the basic area of each of the semiconductor chips 8 can be greater than 2.4 mm×2.4 mm, or greater than 5 mm×5 mm.

Bonding wires 5 are provided for connecting up the semiconductor chips 8, said bonding wires being bonded to sections of the top-side metallization layer 21. Instead of bonding wires 5, metallic clips can likewise be used, which are connected for example to the top sides of the semiconductor chips and/or to the top-side metallization layer 21 by means of a solder, an electrically conductive adhesive or a layer comprising a sintered, electrically conductive powder.

In order to externally connect the power semiconductor module, for example to a voltage supply, a load, a control device or the like, electrical connection elements 91, 92 are provided, which can be electrically conductively and/or mechanically connected to sections of the top-side metallization layer 21. Only some of the connection elements 91, 92 of the semiconductor module 100 are illustrated by way of example. In principle, the number and the design of the connection elements 91, 92 can be chosen as desired and can be adapted to the electrical circuit to be realized in the semiconductor module 100. Some of the connection elements 91, 92 can serve e.g. to connect the semiconductor module 100 to a supply voltage, for example an intermediate circuit voltage or an AC voltage to be rectified. A load, e.g. an inductive load, such as a motor, for example, can be connected to other connection elements 91, 92 in order to drive it by means of the semiconductor module 100. Still other connection elements 91, 92 can serve as control inputs or as control outputs, or as output connections for outputting signals representing information regarding the status of the power semiconductor module 100.

In order to electrically conductively connect the connection elements 91, 92 to the upper metallization layer 21, they can be soldered, welded, sintered or electrically conductively adhesively bonded on to the upper metallization layer 21 or can be connected thereto by wire bonding. The connection elements 91, 92 can be embodied e.g. as straight or bent metallic pins, as stamped and bent metallic sheets, as small tubes, as electrically conductive contact springs, etc. In the case of pins, the latter can also be inserted into sleeves which are soldered, welded or electrically conductively adhesively bonded on to the upper metallization layer 21. Independently of the configuration of the other connection elements 91, 92 of a semiconductor module 100, a connection element 91, 92 such as e.g. the connection element 92 shown can also have a plurality of connection legs at which it is electrically conductively connected to the upper metallization layer 21.

At their free ends spaced apart from the substrate 2, the connection elements 91, 92 can be configured arbitrarily depending on the desired electrical connection technique, e.g. as shown as screw-on openings, but also as soldering contacts, as spring contacts, as press-fit contacts, as clamping contacts, etc.

Independently of their configuration, one or a plurality of connection elements 91, 92 can, as shown, be arranged between two outer wall sections 61 situated at opposite sides of the housing 6 and can be spaced apart therefrom.

Optionally, the substrate 2 can be arranged on a solid baseplate 1 and at its lower metallization layer 22 can be mechanically connected thereto using a connecting layer 42. The connecting layer 42 can be e.g. a solder layer, a pressure-sintered, silver-containing connecting layer or an adhesive layer. The baseplate 1 itself can be embodied as a metallic plate, for example composed of copper, aluminum or an alloy comprising at least one of said metals, or composed of a metal-matrix composite material (MMC). Optionally, it can also have a coating for example in order to improve the solderability or the adhesion of a sintered connecting layer. Independently of its configuration, the baseplate 1 can have a thickness of at least 1 mm, at least 2 mm or at least 3 mm. The lower metallization layer 22 can have for example a thickness of less than or equal to 1 mm or of less than or equal to 0.63 mm.

A unit comprising a substrate 2 previously populated—in the manner explained—with one or a plurality of semiconductor chips 8 and one or a plurality of connection elements 91, 92, which substrate 2 can optionally be connected to a baseplate 1, can then be connected to a housing 6. For this purpose, the housing 6 can be embodied integrally and have a shaft 65 for each of the connection elements 91, 92, said shaft 65 being embodied such that, when the housing 6 is placed on to the unit, the connection elements 91, 92 can be pushed into the associated shafts 65, such that their free ends are accessible on the outer side of the housing 6 for the purpose of making electrical contact with the connection elements 91, 92.

The housing 6 placed onto the unit can be connected to the unit with the aid of a connecting means 9, for example an adhesive.

After the emplacement of the housing 6, optionally also after the connection of the unit to the housing 6, a first potting compound 51, for example a silicone gel, can be filled into said housing. For this purpose, the first potting compound 51 can be filled into the interior of the housing 6 via a filling shaft 64, which is formed by one of the shafts 65, such that said potting compound is distributed on the substrate 2. In this case, the amount of the first potting compound 51 is dimensioned such that the ends 631 of the shaft walls 63 facing the carrier 20 dip into the first potting compound 51 and also remain dipped therein after the first potting compound 51 has subsequently been cross-linked in order to reduce or eliminate the flowability thereof. In this case, the crosslinking can be effected by an increase in temperature, by long storage under normal ambient conditions or by irradiation with ultraviolet light. The result is shown in FIG. 1B. In this and all other configurations of the invention, the crosslinking can be effected such that only a low degree of crosslinking is present, with the result that the first potting compound 51 is only incipiently gelled in order to close the shafts 65 to an extent such that a second potting compound 52, if the latter is subsequently filled into the shafts 65 as explained further below, can pass only as far as the closure locations produced by the first potting compound 51 and thus remains in a position above the first potting compound 51.

By virtue of the fact that the ends 631 of the shaft walls 63 facing the carrier 20 are dipped into the first potting compound 51 even after the crosslinking thereof, the first potting compound 51 seals the relevant shaft 65 in interaction with the connection element 91, 92 situated in said shaft 65 if a second potting compound is subsequently filled therein, as described below. The filling shaft 64 is also correspondingly sealed by the first potting compound 51 in the region of its ends 631. In principle, the dipping depth t63 after the crosslinking of the first potting compound 51 in the case of the ends 631—facing the carrier 20—of the shaft walls 63 of one, a plurality or each of the shafts 65 (including the filling shaft 64) of the semiconductor module 100 can be greater than or equal to 0.5 mm.

Independently of this, in the case of one, a plurality or each of the shaft walls 63 of the semiconductor module 100, the distance d2 between the top side 201 and the end 631 of the relevant shaft wall 631 facing the carrier 20 can be a maximum of 4 mm or a maximum of 2 mm.

After the crosslinking of the first potting compound 51, the shafts 65 and the optional filling shaft 64 are closed by the first potting compound 51 in each case at their ends 631 facing the carrier 20, such that a second potting compound 52, for example an epoxy resin or some other potting having a sufficiently high diffusion resistance or a sufficiently low diffusion coefficient for water vapor, can then be filled into the interior of the housing 6, and forms a barrier against the penetration of water vapor and/or other harmful substances into the interior of the housing 6. In this and all other configurations of the invention, for this purpose the second potting compound 52 can have a diffusion coefficient for water vapor which is less than $5*10^{-9}$ m$^2$/s (5E10-9 m$^2$/s) at a temperature of 40° C.

In particular configurations, the second potting compound of the invention can have a diffusion coefficient for water vapor of less than $5*10^{-9}$ m$^2$/s (5E-9 m$^2$/s), of less than $1*10^{-12}$ m$^2$/s (1E-12 m$^2$/s), or of less than $1*10^{-11}$ m$^2$/s (1E-11 m$^2$/s), in each case at 40° C. In the example shown, the second potting compound 52 has to be filled in each case individually into the individual shafts 65 and the filling shaft 64, since these are now closed and so the second potting compound 52, unlike the first potting compound 51 previously, cannot be distributed laterally over the interior of the housing. The second potting compound 52, which is filled into the shafts 65 and then cured, seals the relevant shaft 65 in interaction with the connection element 91, 92 situated in said shaft 65. The filling shaft 64 is also sealed by the second potting compound 52. The result is illustrated in FIG. 1C.

In all semiconductor modules 100 of the invention, the first potting compound 51 can optionally have, after crosslinking, a penetration which is greater than the penetration of the second potting compound 52 after the crosslinking thereof. Independently of this, the penetration of the finished crosslinked second potting compound 52 can be greater than the penetration of the housing 6. The penetration is determined according to DIN ISO 2137 in each case. The first potting compound can have e.g. a penetration of at least 20, for example in the range of 30 to 90. Independently of this, the second potting compound can optionally have, likewise in all semiconductor modules 100 of the invention, e.g. a penetration of at most 20, for example in the range of 10 to 20.

Independently of this, in the exemplary embodiments of the invention explained with reference to the previous figures and also in all other exemplary embodiments of the invention, the finished cross-linked second potting compound 52 can have a penetration which ranges from the penetration of a gel to the penetration or hardness of an epoxy resin or polyester resin. By way of example, epoxy resins polyester resins, silicone resins or silicone gels are suitable as suitable second potting compounds 52.

As is shown in FIG. 1C, the filling level of the cured second potting compound 52, relative to the top side 201 of the circuit carrier 20, can extend as far as above the level of the underside 622 of the housing cover 62 facing the circuit carrier 20.

At all events, one or a plurality of volume regions 60 filled with gas, e.g. air, remain, each of which directly adjoins the first potting compound 51, such that a change in the volume of the first potting compound 51 caused by loading as a result of temperature cycles is largely compensated for because the gas situated in the volume region or volume regions 60 can be compressed or expanded as necessary, without the elements of the semiconductor module 100 that are situated in the housing 6 being subjected to significant pressure loads in the process. In this case, a "volume region" should be understood to mean the maximum volume of a continuous gas-filled spatial region which directly adjoins the first potting compound 51 and in which the particles of the gas can move freely.

Figure 10:
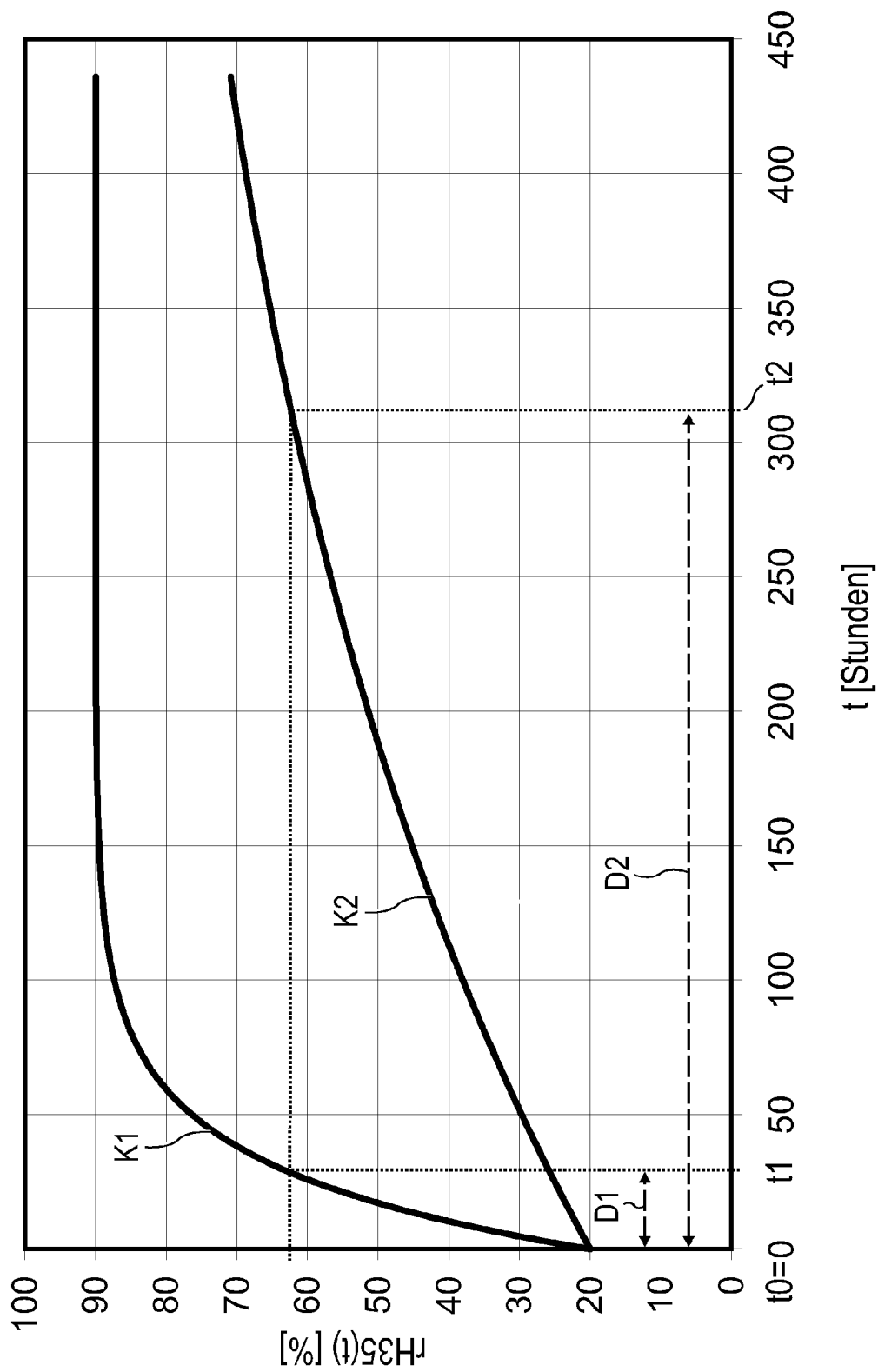

As is likewise evident from FIG. 10, it is possible to choose the filling level of the cross-linked first potting compound 51 relative to the level of the top side 201 such that each, a plurality or all of the volume regions 60 directly adjoining the first potting compound 51 in the interior of the semiconductor module 100 have an identical or different height t60 in a vertical direction v perpendicular to the top side 201, each of said heights being e.g. greater than or equal to 1 mm or greater than or equal to 5 mm. This ensures that for a thermally governed expansion of the first potting compound 51 enough volume is available into which the first potting compound 51 can expand.

Furthermore, FIG. 10 shows that shafts 65—measured in a direction v perpendicular to the top side 201 of the circuit carrier 20—have a filling level t65. In this case, the filling levels t65 of the different shafts 65 of the semiconductor module 100 can be identical or different. By way of example, in one, a plurality or all of the shafts 65 of the semiconductor module 100, the respective filling level t65 can be at least 1 mm. This optional criterion can also be realized in all other semiconductor modules 100 of the present invention.

In order to achieve a particularly efficient effect of the volume region 60 or of the volume regions 60, it is advantageous if, in one, a plurality or all of the shafts 65 of the semiconductor module 100, the external dimensions b65 of the relevant shaft 65 measured parallel to the top side 201 are less than or equal to 5 mm.

Figure 2A:
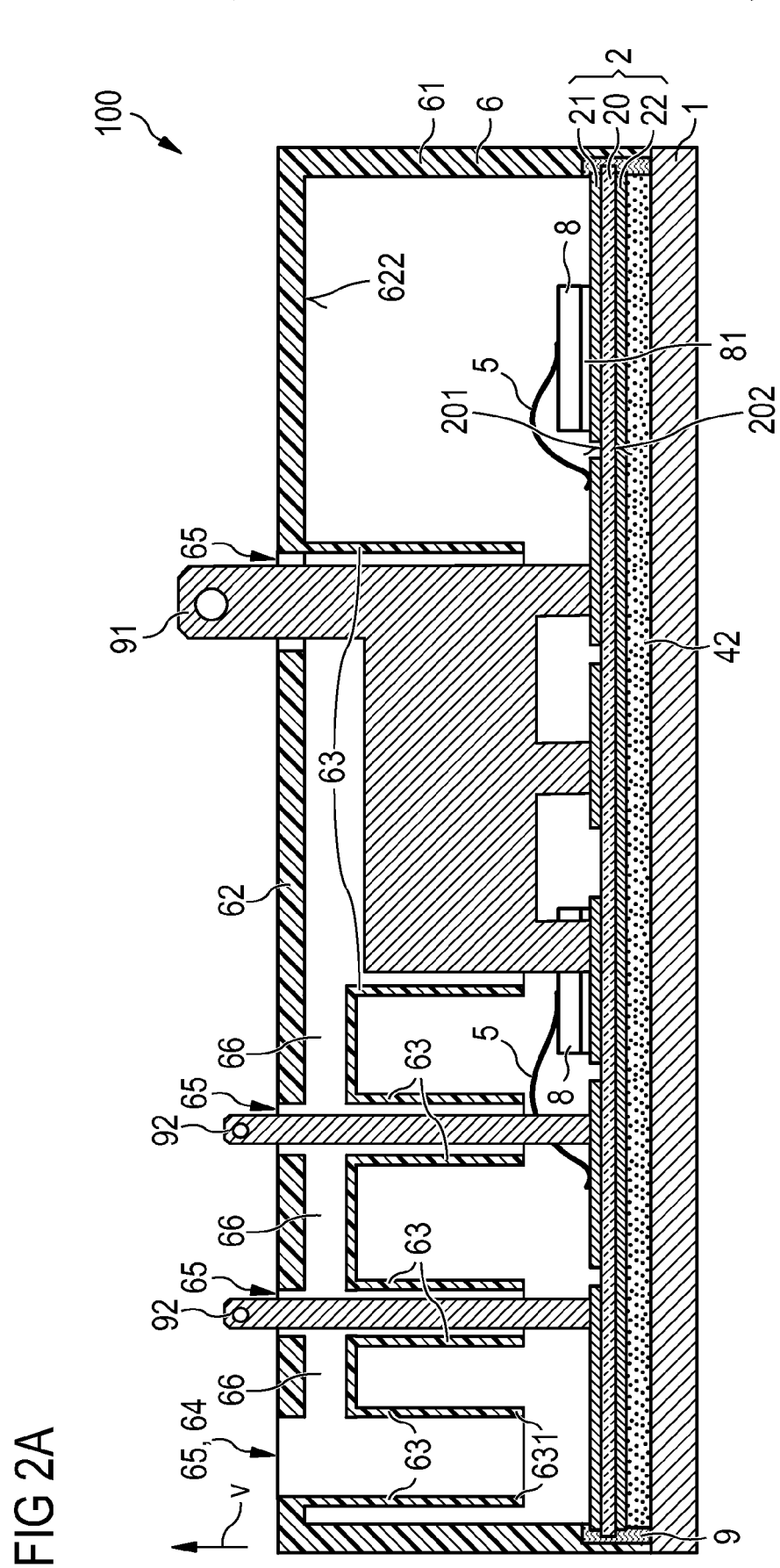

FIG. 2A shows a cross section through a partly finished semiconductor module 100, which differs from the partly finished semiconductor module 100 in accordance with FIG. 1A merely in that various shafts 65 and the filling shaft 64 are connected to one another by connecting channels 66 running horizontally. The connecting channels 66 can optionally be arranged such that all of the shafts 65 and the filling shaft 64 form a channel system via which the second potting compound 52 is distributed along the individual shafts 65 and the filling shaft 64 and seals them when it is filled into the interior of the housing 6 via the filling shaft 64.

Figure 2C:
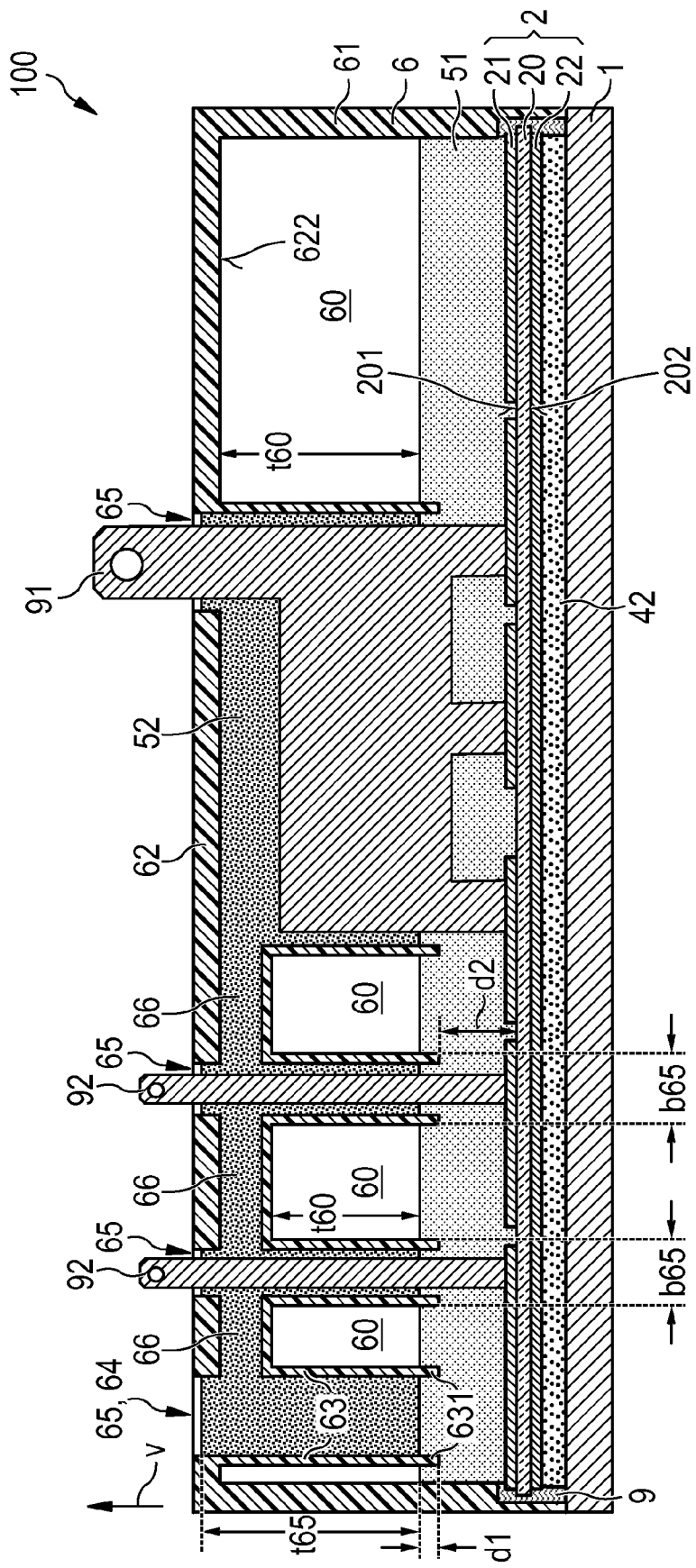

FIG. 2B shows the arrangement after the filling and crosslinking of the first potting compound, and FIG. 2C after the filling and curing of the second potting compound 52.

FIG. 3 shows a cross section through a semiconductor module 100 which differs from the semiconductor module 100 shown in FIG. 10 merely in that it has no baseplate 1 and no connecting layer 42, such as were described above, rather that the lower metallization layer 22 is exposed at the underside of the semiconductor module 100, and that the course of the housing 6 in the connecting region with respect to the substrate 2 and also the course of the connecting means 9 have been adapted.

FIG. 4 shows a cross section through a semiconductor module 100 which differs from the semiconductor module 100 shown in FIG. 2C merely in that it has no baseplate 1 and no connecting layer 42, such as were described above, rather that the lower metallization layer 22 is exposed at the underside of the semiconductor module 100, and that the course of the housing 6 in the connecting region with respect to the substrate 2 and also the course of the connecting means 9 have been adapted.

Figure 5:
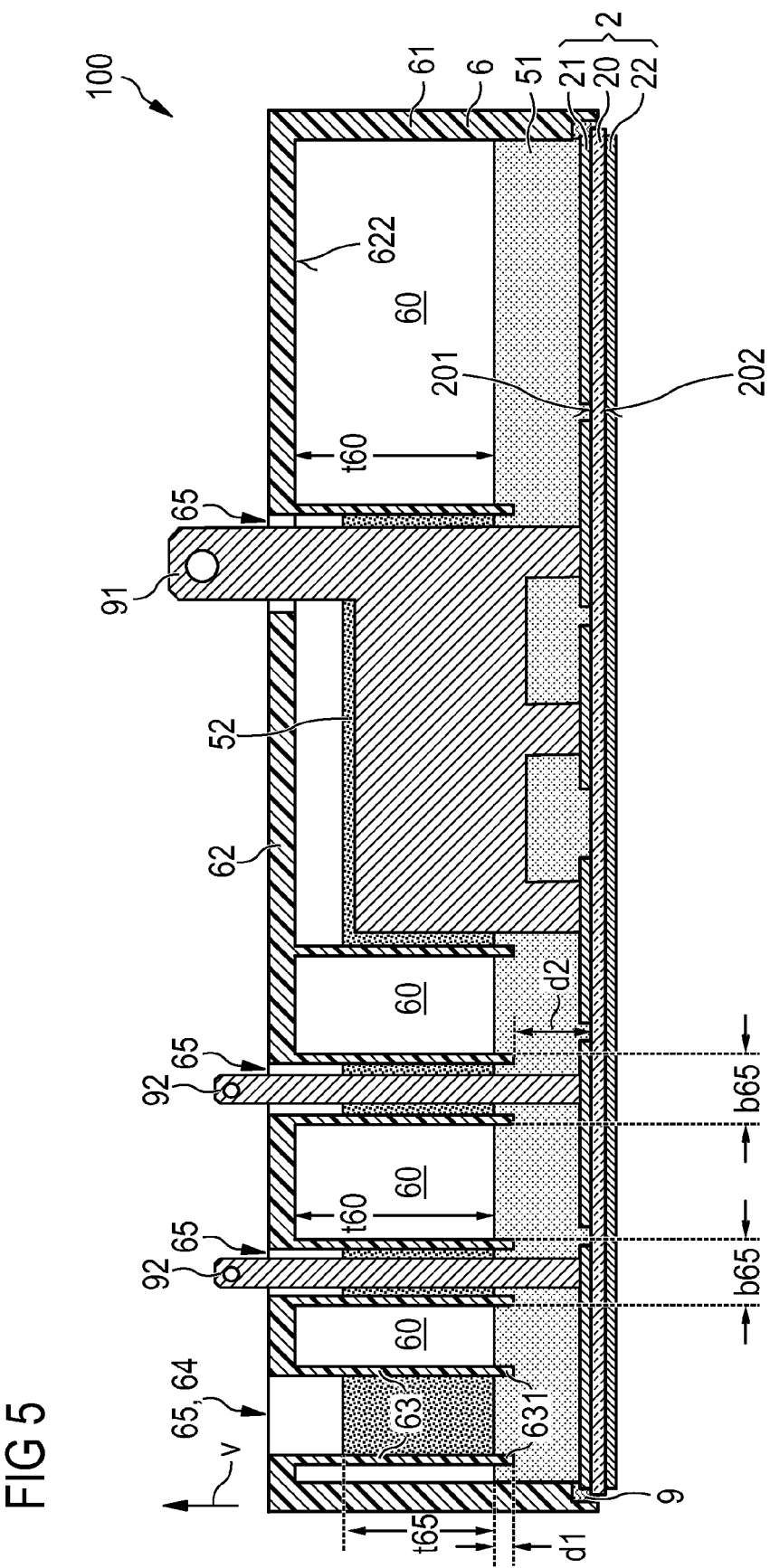

FIG. 5 shows a further example of a semiconductor module 100. The latter differs from the semiconductor module 100 in accordance with FIG. 3 merely in that the filling level of the cured second potting compound 52, relative to the top side 201 of the circuit carrier 20, is smaller than the distance between the top side 201 of the circuit carrier 20 and the underside 622 of the housing cover 62 facing the circuit carrier 20.

FIG. 6 correspondingly shows a semiconductor module 100 which differs from the semiconductor module 100 shown in FIG. 4 merely in that the filling level of the cured second potting compound 52, relative to the top side 201 of the circuit carrier 20, is smaller than the distance between the top side 201 of the circuit carrier 20 and the underside 622 of the housing cover 62 facing the circuit carrier 20.

FIG. 7 shows a housing 6 of a semiconductor module 100, here on the basis of the example of the housing 6 of the semiconductor module 100 elucidated in FIG. 10. Generally, a housing 6 of a semiconductor module 100 can be formed integrally, i.e. from a single part, and consist of any uniform material, for example a thermoplastic or a thermosetting plastic. Such a housing 6 can be produced by injection molding, for example. If permitted by the undercuts of the housing 6 to be produced, a housing 6 can be produced in one piece by injection molding. Alternatively, there is also the possibility of two or more housing parts being produced separately by injection molding and then being fixedly connected to one another, thus giving rise to an integral housing 6. The connection can be effected cohesively, e.g. with the aid of an adhesive, by laser, ultrasonic or thermal welding, or by screwing or any other connecting techniques.

In principle, the housing 6 can be embodied integrally as explained already in the uninstalled state, i.e. in a state in which it has not yet been mounted on the above-explained unit with the previously populated substrate 2 (with or without baseplate 1).

Figure 8A:
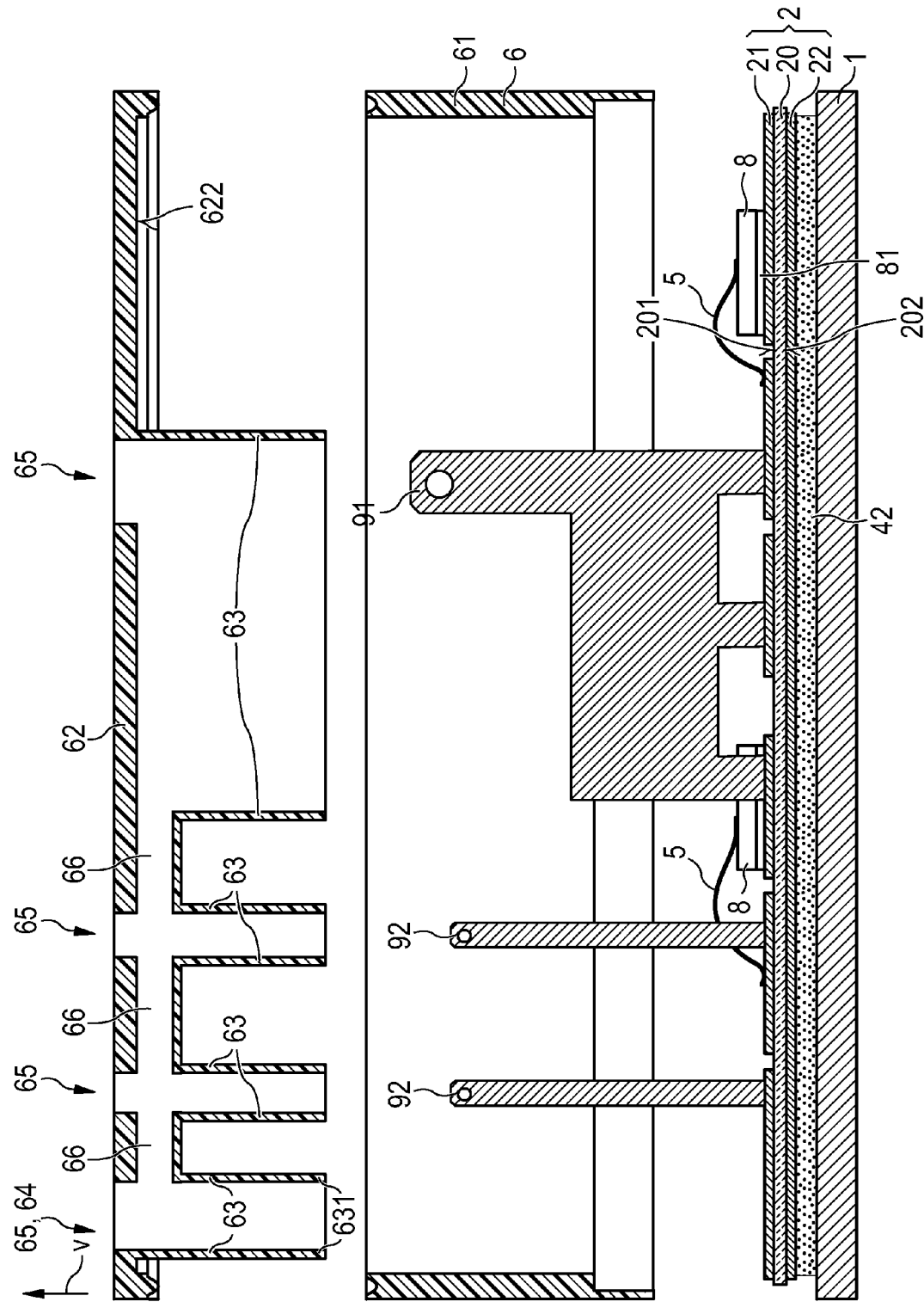
FIGS. 8A to 8C show different steps during the production of a semiconductor module having a multipartite housing.

As an alternative thereto, however, a housing 6 can also be assembled from two or more parts, which will be explained by way of example with reference to FIGS. 8A, 8B and 8C. FIG. 8A shows at the bottom a unit comprising a previously populated substrate 2 and a baseplate 1 connected to the substrate 2, as was described above with reference to FIGS. 1A to 10. FIG. 8A also shows a housing 6 having a circumferential housing frame, which forms the side walls 61, and a cover 62, which is independent of the housing frame and on which shaft walls 63 are embodied for realizing the shafts 65 including the filling shaft 64. Moreover, the connecting channels 66 are integrated into the cover 62.

In principle, a housing 6 and/or a second potting compound 52 can have a glass transition temperature which is greater than 50° C., greater than 120° C., greater than 140° C., or even greater than 150° C., which can be achieved with available plastics or potting compounds.

In all semiconductor modules 100 within the meaning of the present invention there is likewise the possibility of using a material having a glass transition temperature in the range of 55° C. to 95° C., for example of approximately 90° C., for the housing 6 and/or the second potting compound 52. Such a configuration has the effect that the glass transition temperature is exceeded during the operation of the semiconductor module 100, such that the water vapor permeability of the housing 6 and/or of the second potting compound 52 rises and the moisture is driven out from the interior of the housing 6 and delivered to the outer environment of the housing 6. Temperatures of 40° C. and relative air humidities of 90% rH are generally not exceeded at customary ambient conditions.

The housing frame and the cover 62—taken by themselves in each case—can be embodied integrally, i.e. from a single part, and consist of a uniform material, for example a thermoplastic or a thermosetting plastic. In this case, the housing frame and the cover 62 can be formed from the same material or from different materials. The housing frame and housing cover 62 can be produced e.g. by injection molding. The housing 6 can be embodied integrally as explained already in the uninstalled state, i.e. in a state in which it has not yet been mounted on the above-explained unit with the previously populated substrate 2 (with or without baseplate 1).

Figure 8B:
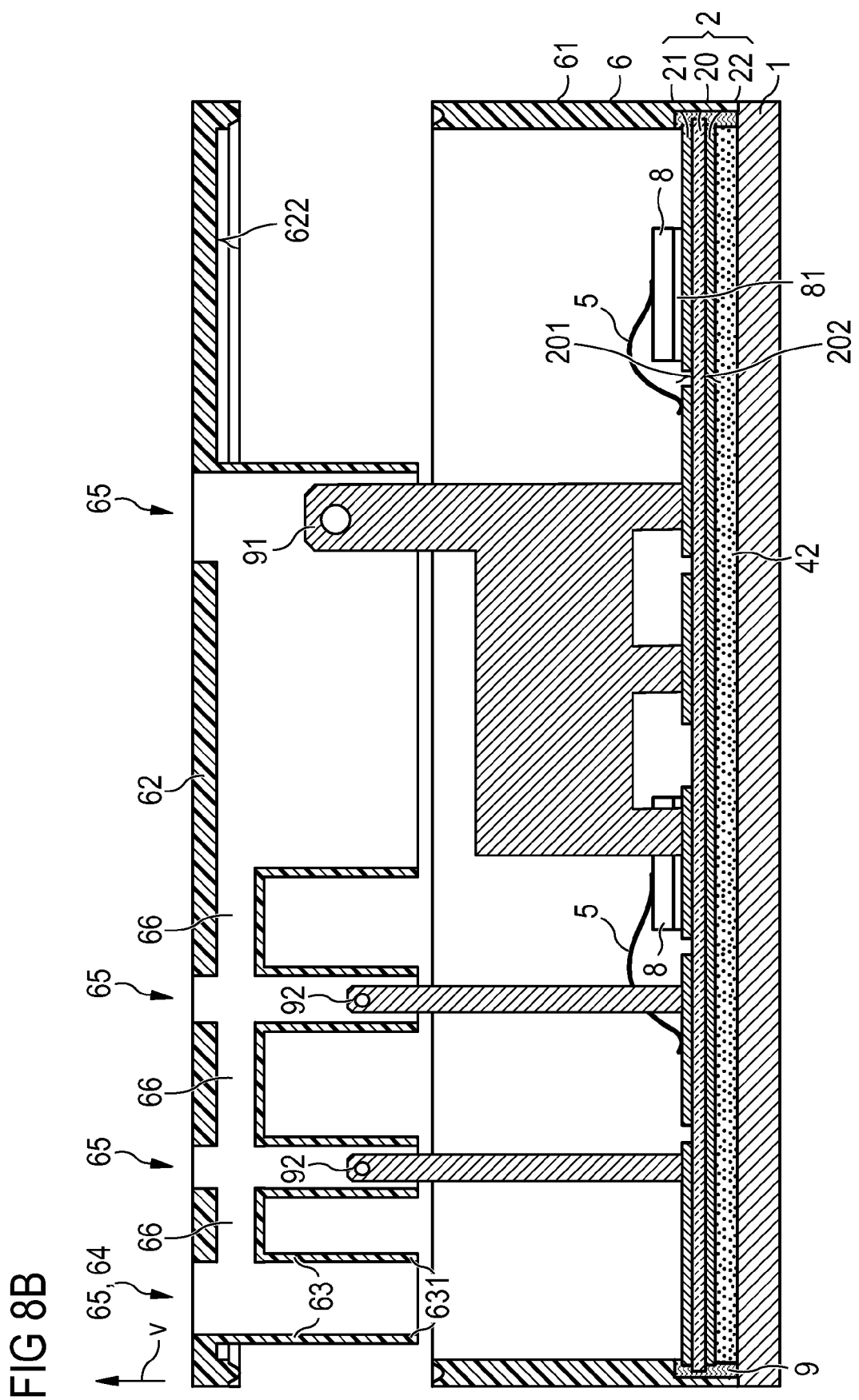

The further mounting can then be effected such that the housing frame is placed on to the unit with the previously populated substrate 2 and is connected thereto, for example with the aid of the connecting means 9 or in some other way, the result of which is shown in FIG. 8B.

Figure 8C:
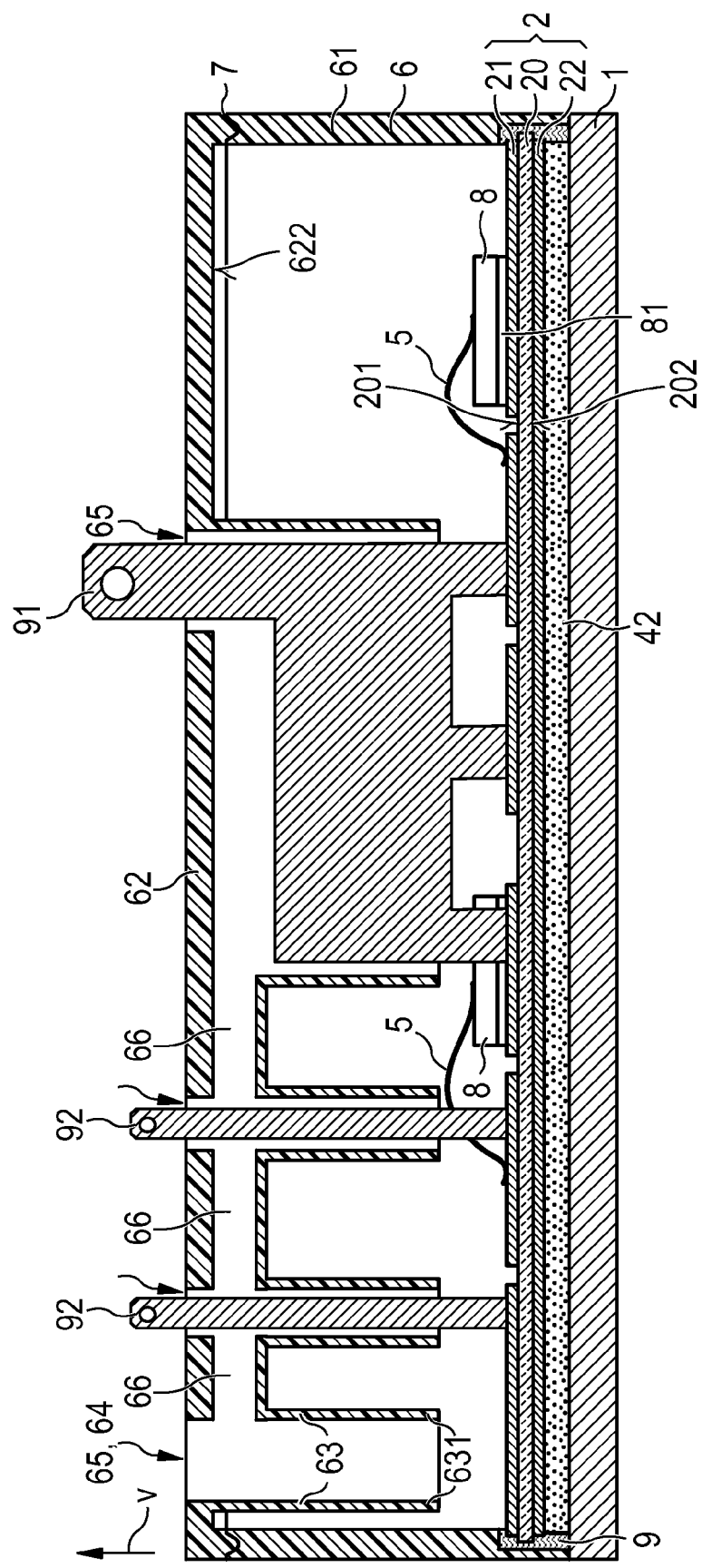

Afterward, as is illustrated in FIG. 8C, the housing cover 62 is placed onto this composite assembly and is then connected to the housing frame. The connection can be effected cohesively, e.g. with the aid of an adhesive, by laser, ultrasonic or thermal welding, or by screwing or any other connecting techniques. As is shown in FIG. 8A, the connection between housing frame and cover 62 can be embodied as a tongue-and-groove connection. This firstly facilitates the mounting of the cover 62 on the housing frame and secondly increases the length of the gap 7 between cover 62 and housing frame and in association therewith reduces the risk of harmful substances penetrating through the gap 7 and possibly through an adhesive situated therein into the interior of the housing 6. In the example shown in FIGS. 8A to 8C, the groove is embodied on the housing frame and the tongue on the housing cover 62. Conversely, however, the tongue can also be embodied on the housing frame and the groove on the housing cover 62. Apart from the fact that the housing 6 is not embodied integrally, the arrangement shown in FIG. 8C is identical to the arrangement in accordance with FIG. 10. In the same ways, housings 6 of arbitrary other semiconductor modules 100 can also be embodied and produced in two parts or in a multipartite fashion.

The connection between the housing frame and the cover 62 can be produced, in principle, before or after the filling of the first potting compound 51 and/or the second potting compound 52, alternatively also by means of the filling of the second potting compound 52. In the last-mentioned case, the second potting compound 52 also acts as an adhesive that connects the housing frame and the cover 62.

In order to complete a semiconductor module 100 as illustrated in FIG. 8C, a first potting compound 51 is also filled into the housing 6 of said semiconductor module, followed by a second potting compound 52 in accordance with the method explained above.

In all semiconductor modules of the invention, the second potting compound 52 in interaction with the shafts 65 constitutes an effective barrier against the penetration of moisture and possibly other harmful substances into the interior of the housing 6. This barrier effect is all the higher, the smaller the gaps between the shafts 65 and the connection elements 91, 92 respectively running through the latter, the smaller the cross-sectional area of the filling opening 64 and the larger the layer thickness of the second potting compound 52.

Figure 9:
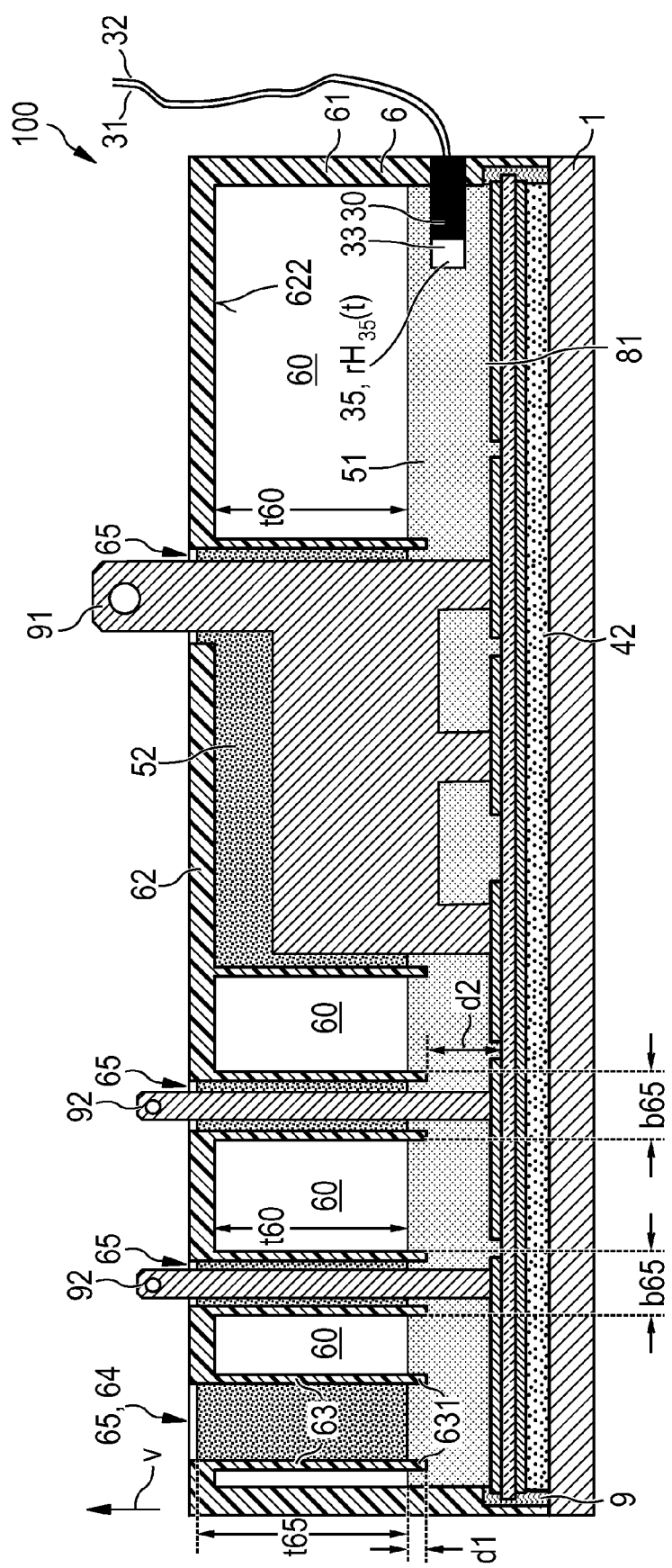

In order to test the explained sealing effect for a specific semiconductor module 100, use can be made of a comparative or "dummy" module 101, as shown by way of example in FIG. 9. Such a comparative module 101 can be constructed in the same way as the underlying semiconductor module 100 with the sole difference that a sensor element is incorporated into a cavity 35 produced in the first potting compound 51 (see e.g. FIG. 10), which sensor element can be read via connection lines 31, 32 and serves for determining the relative air humidity present in said cavity. Optionally, a temperature sensor element and/or a pressure sensor element can also be arranged in the cavity 35. One, a plurality or all of said sensor elements can be integrated in a common sensor 30 as shown. However, the sensor elements can also be integrated into separate sensors situated in the cavity, or two sensor elements, e.g. for determining the temperature and the relative air humidity, can be integrated in a common sensor 30, while the pressure sensor element is integrated in a further sensor, which is likewise arranged in the cavity 35. It is also possible, as necessary, to use more than two electrical connection lines for connecting up the sensor 30 and—if present—one or a plurality of additional sensors.

Such a comparative module 101 can be produced, for example, by a procedure in which, in the case of a semiconductor module 100 wherein the interior of the housing 6 has been potted with the first and with the second potting compound 51, 52, the first potting compound 51 is removed again. This can be done, for example, by drilling through the housing 6 of a completed semiconductor module 100 until the first potting compound 51 is reached, and, through the drilled hole produced, removing a sufficient amount of the first potting compound 51 such that a cavity 35 arises into which one or a plurality of sensors 30 can be inserted. In this case, the insertion of the sensor or sensors 30 into the cavity 35 is effected such that an air-filled measurement volume 33 remains behind the sensor or sensors 30, the relative air humidity of which measurement volume is detected. In this case, the connections 31, 32 are led through the drilled hole toward the outside and the drilled hole is then tightly closed, which can be effected e.g. by means of an adhesive such as e.g. an epoxy resin adhesive.

Alternatively or supplementary, such a sensor 30 could also be inserted into the or into one of the volume regions 60 in a corresponding manner. In this case, the relevant volume region 60 would form the cavity 35. The partial removal of the first potting compound 51 through the drilled hole would be obviated in this case.

There is likewise the possibility of embedding one or a plurality of sensors 30 into the first potting compound 51 during the filling thereof. In order to ensure that a cavity 35 remains with an air volume which extends as far as the sensor element situated in the sensor 30, the sensor 30 can be covered by an air-permeable, for example grid-like protective cap which retains the first potting compound 51 when the latter is filled into the housing 6.

Furthermore, one or a plurality of such sensors 30 can also be arranged in a volume region 60 prior to the filling of the potting compounds 51 and 52 and then, as already explained, firstly the first potting compound 51 and subsequently the second potting compound 52 can be filled into the housing 6.

In principle, still other variants which can be used to produce such a comparative module 101 are also conceivable. What is of importance in any case is that an air-filled measurement volume 33 which is situated in the housing 6 and which extends as far as the sensor element situated in the sensor 30 directly adjoins the first potting compound 51.

With the aid of such a comparative module 101 it is now possible to examine the sealing effect by measuring the relative air humidity in the cavity 35 if the comparative module 101 is situated in a defined environment at constant temperature $T_{EXT}$, constant relative air humidity $rH_{EXT}$ and constant pressure $P_{EXT}$ and the temporal development of the relative air humidity in the measurement volume 33 is measured. It is assumed here that the interior of the module, before the beginning of the measurement, has a humidity that is significantly lower than the relative humidity in the defined environment, and an air pressure that is identical or substantially identical to the pressure in the defined environment. The assumption of a significantly lower relative humidity can be attained by drying the semiconductor module 100 at high temperature. Since the relative air humidity is greatly dependent on the temperature, the comparative module, in preparation for measuring the temporal development of the relative air humidity, can firstly be brought to a specific temperature, for example 20° C., and then at a point in time t0 can be introduced into a defined environment which is at the same temperature and the relative air humidity of which is higher than the relative air humidity $rH_{35}(t=t0)$ which is present at the point in time t0 in the cavity 35 (likewise at the specific temperature). Since the value of the relative air humidity present in the cavity 35 is dependent on the variables of pressure and temperature prevailing in the cavity 35, the temporal development of said variables can likewise be measured, with the result that it is possible to convert the relative air humidity measured in a time-dependent manner to standard values of pressure and temperature (for example 1013.25 hPa and 20° C.) and thereby to obtain comparable results.

Starting from the point in time t0, the humidity contained in the environment penetrates into the housing 6 and in the process also reaches the gas (e.g. air) situated in the cavity 35, such that the relative humidity $rH_{35}(t)$ thereof increases with time t. As a measure of the sealing effect, in the present case use is made of the duration D after which the initial relative air humidity $rH_{35}(t=t0)$ present in the cavity 35 at the point in time t0—relative to a pressure of 1013.25 hPa and 20° C.—rises by 0.6 times the difference between the relative ambient air humidity rH35(t=t0+D) and the relative initial humidity $rH_{35}(t=t0)$—likewise relative to a pressure of 1013.25 hPa and 20° C. Said duration D can be, for example, at least 24 hours, at least 48 hours, at least 168 hours or at least 400 hours.

In this respect, FIG. 10 shows, for two semiconductor modules sealed with different degrees of success, the respective temporal development of the relative air humidity $rH_{35}(t)$ present in the cavity 35 starting from the point in time t0, i.e. starting from the introduction of the relevant comparative module 101 into the environment having defined relative humidity $rH_{EXT}$, defined temperature $T_{EXT}$ and defined pressure $p_{EXT}$. Curve 1 corresponds to the profile of the more poorly sealed comparative module 101, and curve 2 corresponds to the profile of the better sealed comparative module 101. In the examples shown, the initial relative air humidity $rH_{35}(t=t0)$ in the cavity 35 at a temperature of 20° C. is 20%, while the defined relative humidity $rH_{EXT}$ in the environment of the respective comparative module 101 at 20° C. is 90%.

The sealing effect is then determined by determining in each case the duration for which the relative humidity $rH_{35}(t)$ in the cavity 35 has risen by 0.6 times the difference (90%-20%=70%), that is to say by 0.6*70%=42%, in relation to the initial relative humidity $rH_{35}(t=t0)$ amounting to 20%, i.e. until the relative air humidity $rH_{35}(t)$ has risen to a value of 20%+42%=62%. In the case of the more poorly sealed comparative module 101 (curve K1), this value of 62% is reached at a point in time t1, that is to say after a duration D1=t1−t0, and in the case of the better sealed comparative module 101 (curve K2) said value is reached at a point in time t2, that is to say after a duration D2=t2−t0. In the examples shown, D1=28 hours and D2=310 hours.

FIG. 11 shows a horizontal section through the arrangement in accordance with FIG. 2C in a sectional plane E-E running through the shafts 65 and the (in this example sole) volume region 60. However, the same sectional view would also arise in the case of a corresponding section through the semiconductor modules 100 from FIGS. 10 and 3 to 6.

As can be discerned in this view, all shafts 65 of the semiconductor module 100 that are delimited by the shaft walls 63 either are sealed, as in the case of the filling shaft 64, only by the second potting compound 52 or are sealed, as in the case of the other shafts 65, by the second potting compound 52 in conjunction with the connection element 91, 92 running in the relevant shaft 65, such that the atmosphere situated outside the housing 6 cannot pass directly through the shafts 64, 65 to the first potting compound 51.

It can likewise be discerned that the semiconductor module 100 contains just a single volume region 60, the orthographic projection of which on to the top side 201 of the circuit carrier 20 has an area A60. In other semiconductor modules 100, two or more volume regions 60 independent of one another in pairs can also be present. In this case, "independent" means that no free gas exchange is possible between two independent volume regions 60. In the case of two or more volume regions 60 that are independent in this sense, their orthographic projection onto the top side 201 of the circuit carrier 20 can form a continuous area A60, or else two or more independent areas, the total area of which is again A60. Independently of whether a semiconductor module 100 has only exactly a single or else two or more volume regions 60 of this type, A60 indicates the total projection area of all volume regions 60 directly adjoining the first potting compound 51.

FIG. 11 furthermore illustrates with a broken line, because it is concealed, the lateral boundary line of the top side 201 of the circuit carrier 20, the area size of which is designated by A20. The semiconductor module 100 can be configured, then, such that the ratio of A60 to A20 is greater than or equal to 0.7, that is to say that A60 is at least 70% of A20.

The shafts 65 provided in the present invention make it possible to use only very little second potting compound 52 in conjunction with a high sealing effect against the penetration of moisture and other harmful substances into the housing 6. By way of example, the second potting compound 52 can have a total mass which, relative to the area A20 of the top side 201, is less than or equal to 1 gram per square centimeter.

Independently of this, the cured second potting compound 52 and the material of the housing 6 can be chosen such that the solubility of water in the second potting compound 52 and in the housing is in each case a maximum of 0.5% by weight or a maximum of 0.2% by weight relating to the common weight of second potting compound 52 and housing 6.

Various exemplary embodiments for possible configurations of semiconductor modules 100 have been explained above. One or more features mentioned in this context in one exemplary embodiment can be combined in any desired manner with one or more features from one or more other exemplary embodiments, provided that these features are not mutually exclusive.

Various exemplary embodiments of a semiconductor module 100 have been explained above. In these and all other exemplary embodiments of the invention, such potting compounds which are present as gel, for example as silicone gel, after crosslinking can optionally be used here as first potting compound 51. In principle, however, it is possible to use potting compounds 51 which have after crosslinking a penetration according to DIN ISO 2137 of less than 40 and thus a lower penetration than a typical cross-linked gel (penetration according to DIN ISO 2137 in the range of 40-70).

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module, comprising:
a housing having two outer wall sections arranged at opposite outer sides of the housing, a cover extending from one of the outer wall sections to the other one of the outer wall sections, and a first shaft wall arranged between and spaced apart from the outer wall sections, the first shaft wall delimiting a first shaft;
a circuit carrier having a top side;
a semiconductor chip arranged in the housing and on the top side of the circuit carrier;
an electrically conductive first connection element which runs through the first shaft and extends out of the housing;
a first potting compound arranged between the circuit carrier and the cover and partly between the first connection element and the first shaft wall and which seals the first shaft in interaction with the first connection element;
a second potting compound arranged between the first potting compound and the cover and partly between the first connection element and the first shaft wall and which seals the first shaft in interaction with the first connection element; and
at least one gas-filled volume region directly adjoining the first potting compound,
wherein the first shaft wall has at a side facing the circuit carrier a lower end dipping into the first potting compound.

2. The semiconductor module of claim 1, wherein the lower end of the first shaft wall dips into the first potting compound to a depth of at least 0.5 mm.

3. The semiconductor module of claim 1, wherein the second potting compound has a diffusion coefficient for water vapor which is less than $5*10^{-9}$ m$^2$/s at a temperature of 40° C.

4. The semiconductor module of claim 1, wherein a total projection area which arises upon an orthogonal projection of each gas-filled volume region situated in the housing onto the top side of the circuit carrier corresponds to at least 70% of the area of the top side.

5. The semiconductor module of claim 1, wherein the first potting compound has a penetration according to DIN ISO 2137 which is greater than a penetration according to DIN ISO 2137 of the second potting compound, and wherein the second potting compound has a penetration according to DIN ISO 2137 which is greater than a penetration according to DIN ISO 2137 of the housing.

6. The semiconductor module of claim 1, wherein the first potting compound has a penetration according to DIN ISO 2137 of at least 20 and/or the second potting compound has a penetration according to DIN ISO 2137 of at most 20.

7. The semiconductor module of claim 1, wherein the first potting compound has a penetration according to DIN ISO 2137 in the range of 30 to 90.

8. The semiconductor module of claim 1, wherein the second potting compound has a penetration according to DIN ISO 2137 of 10 to 20.

9. The semiconductor module of claim 1, wherein the first potting compound has a penetration according to DIN ISO 2137 which is greater than a penetration of the second potting compound according to DIN ISO 2137.

10. The semiconductor module of claim 1, wherein the first potting compound, proceeding from the circuit carrier, extends at least as far as above the semiconductor chip, and wherein the semiconductor chip is spaced apart from the second potting compound.

11. The semiconductor module of claim 1, wherein the cover has an underside facing the circuit carrier, and wherein the second potting compound is spaced apart from the underside.

12. The semiconductor module of claim 1, wherein the cover has an underside facing the circuit carrier, and the second potting compound makes contact with the underside.

13. The semiconductor module of claim 1, wherein the housing comprises a uniform, homogeneous material.

14. The semiconductor module of claim 1, wherein the housing comprises a material that differs from a material of the first potting compound and/or from a material of the second potting compound.

15. The semiconductor module of claim 1, wherein one or more of the at least one volume regions extends over at least 1 mm or over at least 5 mm in a vertical direction perpendicular to the top side of the circuit carrier.

16. The semiconductor module of claim 1, wherein the second potting compound has a total mass and the ratio between the total mass and the area of the top side of the circuit carrier is less than or equal to 1 gram per square centimeter.

17. The semiconductor module of claim 1, wherein the housing has a second shaft wall arranged between the two outer wall sections, the second shaft wall delimiting a second shaft and having at a side facing the circuit carrier a lower end dipping into the first potting compound, wherein an electrically conductive second connection element runs through the second shaft and extends out of the housing, and wherein the housing has a connecting channel connecting the first shaft and the second shaft to one another.

18. The semiconductor module of claim 17, wherein the connecting channel is wholly or partly filled by the second potting compound.

19. The semiconductor module of claim 1, wherein the second potting compound extends in the first shaft over a height of at least 1 mm.

20. A method for producing a semiconductor module, the method comprising:
   providing a housing having two outer wall sections, a cover and a first shaft wall;
   providing a circuit carrier having a top side;
   providing a semiconductor chip;
   providing an electrically conductive first connection element;
   arranging the semiconductor chip, the circuit carrier, the housing and the first connection element relative to one another so that:
      the cover extends from one of the outer wall sections to the other one of the outer wall sections;
      the first shaft wall is arranged between and spaced apart from the outer wall sections and delimits a first shaft;
      the semiconductor chip is arranged in the housing on the top side of the circuit carrier; and
      the first connection element runs through the first shaft and extends out of the housing;
   filling a first potting compound into the interior of the housing and subsequently crosslinking the first potting compound so that the cross-linked first potting compound is arranged between the circuit carrier and the cover and partly between the first connection element and the first shaft wall and seals the first shaft in interaction with the first connection element, wherein the first shaft wall has at a side facing the circuit carrier a lower end dipping into the first potting compound; and
   filling a second potting compound into the interior of the housing after the first potting compound is cross-linked so that the second potting compound is arranged between the first potting compound and the cover and partly between the first connection element and the first shaft wall and seals the first shaft in interaction with the first connection element, and that at least one gas-filled volume region directly adjoining the first potting compound remains in the housing.

* * * * *